United States Patent
Lin et al.

(10) Patent No.: US 9,640,514 B1
(45) Date of Patent: May 2, 2017

(54) WAFER BONDING USING BORON AND NITROGEN BASED BONDING STACK

(71) Applicant: GLOBALFOUNDRIES INC., Grand Cayman (KY)

(72) Inventors: Wei Lin, Santa Clara, CA (US); Troy L. Graves-Abe, Wappingers Falls, NY (US); Donald F. Canaperi, Bridgewater, CT (US); Spyridon Skordas, Troy, NY (US); Matthew T. Shoudy, Niskayuna, NY (US); Binglin Miao, Loudonville, NY (US); Raghuveer R. Patlolla, Guilderland, NY (US); Sanjay C. Mehta, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/084,004

(22) Filed: Mar. 29, 2016

(51) Int. Cl.
*H01L 25/065* (2006.01)
*H01L 21/762* (2006.01)
(Continued)

(52) U.S. Cl.
CPC .... *H01L 25/0657* (2013.01); *H01L 21/76251* (2013.01); *H01L 24/27* (2013.01); *H01L 24/29* (2013.01); *H01L 24/32* (2013.01); *H01L 24/83* (2013.01); *H01L 25/50* (2013.01); *H01L 2224/29084* (2013.01); *H01L 2224/29187* (2013.01); *H01L 2224/32145* (2013.01); *H01L 2224/832* (2013.01);
(Continued)

(58) Field of Classification Search
CPC ..... H01L 21/76251–21/46259; H01L 25/0657
See application file for complete search history.

(56) References Cited

U.S. PATENT DOCUMENTS

| 4,711,386 A | 12/1987 | Mizuhara |
| 2007/0241434 A1* | 10/2007 | Inada ............... H01L 24/83 257/678 |
| 2013/0196483 A1* | 8/2013 | Dennard ......... H01L 29/78603 438/458 |

FOREIGN PATENT DOCUMENTS

| CA | 2690795 A1 | 7/2010 |
| EP | 0153096 B1 | 7/1990 |

(Continued)

OTHER PUBLICATIONS

Chen et al., Synthesis of a material for semiconductor applications: Boron oxynitride prepared by low frequency rf plasma-assisted metalorganic chemical vapor desposition, Journal of Vacuum Science & Technology B 21, 1886 (2003).

(Continued)

*Primary Examiner* — Daniel Luke
(74) *Attorney, Agent, or Firm* — Michael Le Strange; Hoffman Warnick LLC

(57) ABSTRACT

A bonding material stack for wafer-to-wafer bonding is provided. The bonding material stack may include a plurality of layers each including boron and nitrogen. In one embodiment, the plurality of layers may include: a first boron oxynitride layer for adhering to a wafer; a boron nitride layer over the first boron oxynitride layer; a second boron oxynitride layer over the boron nitride layer; and a silicon-containing boron oxynitride layer over the second boron oxynitride layer.

17 Claims, 4 Drawing Sheets

(51) Int. Cl.
*H01L 23/00* (2006.01)
*H01L 25/00* (2006.01)

(52) U.S. Cl.
CPC ............ *H01L 2224/83031* (2013.01); *H01L 2224/83193* (2013.01); *H01L 2224/83896* (2013.01); *H01L 2924/01005* (2013.01); *H01L 2924/01007* (2013.01); *H01L 2924/01008* (2013.01); *H01L 2924/01014* (2013.01); *H01L 2924/0503* (2013.01); *H01L 2924/059* (2013.01); *H01L 2924/05442* (2013.01); *H01L 2924/206* (2013.01); *H01L 2924/2064* (2013.01); *H01L 2924/20109* (2013.01)

(56) References Cited

FOREIGN PATENT DOCUMENTS

| | | | |
|---|---|---|---|
| EP | 0206120 | B1 | 10/1990 |
| EP | 0547684 | A2 | 6/1993 |
| EP | 0412301 | B1 | 7/1994 |
| EP | 0666591 | A2 | 9/1995 |
| EP | 0794566 | A1 | 10/1997 |
| EP | 0719452 | B1 | 12/2001 |
| EP | 1376660 | B1 | 9/2010 |
| EP | 1983071 | B1 | 3/2011 |
| WO | 9504840 | A1 | 2/1995 |
| WO | 2004008486 | A2 | 1/2004 |
| WO | 2004068541 | A2 | 8/2004 |
| WO | 2010006080 | A2 | 1/2010 |
| WO | 2011100030 | A1 | 8/2011 |
| WO | 2011126748 | A2 | 10/2011 |
| WO | 2012088334 | A1 | 6/2012 |
| WO | 2012138356 | A1 | 10/2012 |
| WO | 2013101716 | A1 | 7/2013 |
| WO | WO 2015/178857 | * | 11/2015 |

OTHER PUBLICATIONS

Li et al., Wetting and interfacial properties of water nanodroplets in contact with graphene and monolayer boron-nitride sheets., Departmentof Chemistry and Nebraska Center for Materials and Nanoscience, University of Nebraska, Lincoln, Nebraska, ACS Nano. Mar. 27, 2012; 6(3);2401-9.

Goodson et al., Heat Conduction in Novel Electronic Films, Thermosciences Division, Mechanical Engineering Department, Stanford University, Standard, California, Annu. Rev. Mater, Sci. 1999. 29:261-93, pp. 1-33.

Basa et al., Boron Nitride and Silicon Boron Nitride Film and Polish Characterization, The Electrochemical Society, Inc., J. Electrochem. Soc., vol. 140, No. 12, pp. 3607-3611, Dec. 1993.

* cited by examiner

US 9,640,514 B1

WAFER BONDING USING BORON AND NITROGEN BASED BONDING STACK

BACKGROUND

Technical Field

The present disclosure relates to integrated circuit fabrication and packaging, and more specifically, to wafer bonding that incorporates boron and nitrogen in the bonding stack, and a three-dimensional integrated circuit system so formed.

Related Art

Complex three-dimensional integrated circuit (3Di) systems are commonly formed by bonding wafers including integrated circuits therein. That is, a pair of wafers including integrated circuits therein are mated and bonded together to form a single larger 3Di system. Wafer-to-wafer bonding is advantageous because it provides for higher productivity compared to creating single, larger chips, and it allows for tighter pitch interconnect between chips that can be fabricated with separate technologies specifically optimized for their functionality (e.g., separately optimized memory and processor chips). One challenge of wafer-to-wafer 3Di integration is ensuring a high quality bond interface between the wafers so the wafers properly interconnect and are reliable. Some typical requirements for good bonding include: low temperature bonding (e.g., less than 350° C.) so that the bonding process does not adversely impact the integrated circuits in the wafers; mechanical strength so the bonding does not come apart; and good thermal conductivity to prevent overheating of the coupled wafers.

There are a number of wafer-to-wafer bonding techniques currently in use. The prevalent bonding technique, referred to as SiOx bonding, employs a low temperature oxide (LTO) (e.g., silicon oxide ($SiO_x$ (denoted as SiOx herein)) for the bonding surface on each wafer. During this process, each wafer has an LTO layer formed thereon. The LTO layer is planarized, and may be activated with a plasma etch and rinsed. The wafers are then aligned and brought into contact to initially bond them at room temperature, followed by an anneal to permanently bond the wafers together. While the above-described SiOx bonding process is more advantageous than other current techniques, e.g., copper or adhesive bonding, the SiOx bonding has a number of disadvantages, including, for example: relatively low thermal conductivity that presents a challenge for systems that include multi-stacking of high input/output memory wafers and/or high-power logic wafers. Where more than two wafers are stacked or high-power is involved, the wafers tend to operate at higher temperatures, making high thermal conductivity more important. Further, SiOx bonding has relatively low cohesive bonding energy (e.g., <2.7 Joules per square meter ($J/m^2$)), which may pose challenges for reliability and chip-package interaction (CPI). SiOx bonding is also disadvantageous because it does not present a good barrier to copper diffusion, thus necessitating use of other layers to prevent copper diffusion from integrated circuits in the wafers.

SUMMARY

A first aspect of the disclosure is directed to a bonding material stack for wafer-to-wafer bonding, the bonding material stack comprising: a plurality of layers each including boron and nitrogen. In one embodiment, the plurality of layers may include: a first boron oxynitride layer for positioning adhered to a wafer; a boron nitride layer over the first boron oxynitride layer; a second boron oxynitride layer over the boron nitride layer; and a silicon-containing boron oxynitride layer over the second boron oxynitride layer.

A second aspect of the disclosure includes a method of bonding wafers, the method comprising: for each wafer to be bonded, forming a plurality of layers each including boron and nitrogen to the silicon oxide interface layer; and bonding the wafers together using the plurality of layers.

A third aspect of the disclosure related to a three-dimensional (3D) integrated circuit system, the system comprising: at least two wafers bonded together, each wafer including an integrated circuit therein, wherein at least one wafer of the at least two wafers bonded together includes a plurality of layers bonding the at least one wafer to another wafer of the at least two wafers, each of the plurality of layers including boron and nitrogen.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

A bonding material stack for wafer-to-wafer bonding is provided that employs a plurality of layers including boron and nitrogen.

Figure 1:
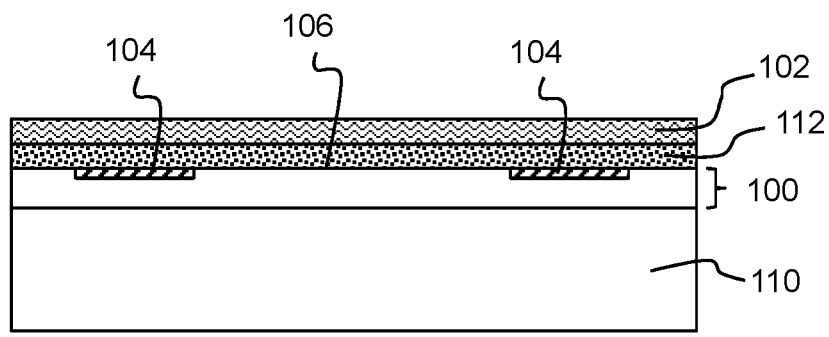
FIG. 1 shows a cross-sectional view of a wafer including a boron and nitrogen based bonding stack according to embodiments of the disclosure.

FIG. 1 shows a cross-sectional view of a wafer 100 including a boron and nitrogen based bonding material stack 102 thereon according to embodiments of the disclosure. Wafer 100 may include any now known or later developed integrated circuit (IC) therein (not shown, embedded in wafer). Each wafer 100 that is bonded may have the same or different circuitry therein. As understood, each wafer 100 includes interconnects 104 at a bonding surface(s) 106 thereof for electrical interconnection to another wafer 100 having mating electrical interconnections. Although two interconnects 104 are shown for purposes of illustration, it is understood that any number of interconnections may be employed. Further, as known in the art, interconnects 104 can be provided on one bonding surface 106 (as shown) or two bonding surfaces 106, e.g., at a top and bottom of wafer 100. In any event, bonding of two or more wafers 100 together creates a three dimensional (3D) integrated circuit (IC) system (i.e., a 3Di system). In order to position wafer(s)

100 for bonding, each wafer may have a handle wafer 110 temporarily adhered to a side thereof in a conventional fashion. Handle wafer 110 may be removed once a 3Di system is formed.

In one embodiment, wafer 100 may have a silicon oxide (SiOx) interface layer 112 on bonding surface 106 to which a bonding material stack 102 according to embodiments of the disclosure will be applied. SiOx interface layer 112 may include any now known or later developed low temperature oxide (LTO) typically used for bonding wafers and/or creating a planar surface therefor. SiOx interface layer 112 may be formed on bonding surface 106 in any now known or later developed fashion, e.g., depositing. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. SiOx interface layer 112 can receive a chemical-mechanical polish (CMP) process to planarize the wafer surface prior to deposition of the bonding material stack 102.

Figure 2:
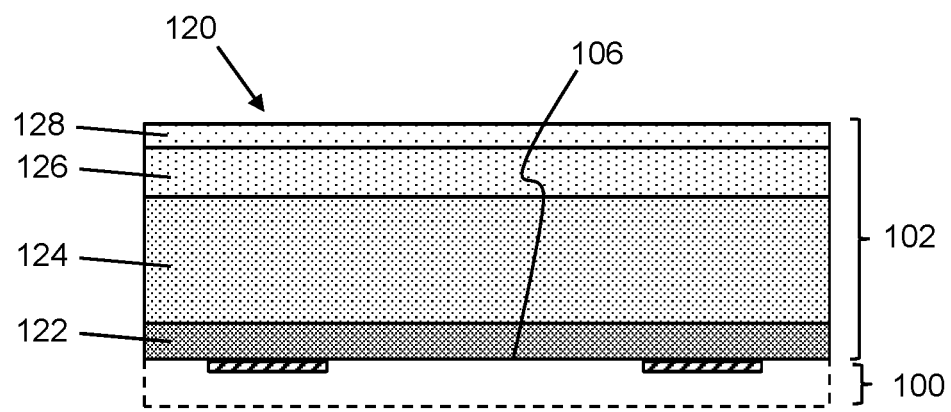
FIG. 2 shows an enlarged cross-sectional view of a boron and nitrogen based bonding stack according to embodiments of the disclosure.

FIG. 2 shows an enlarged cross-sectional view of a bonding material stack 102 (also referred to herein as a boron and nitrogen based bonding stack) according to embodiments of the disclosure. As shown in FIG. 2, in some embodiments, SiOx interface layer 112 may not be necessary and can be omitted, e.g., where the wafer starts with minimal topography. In this case, bonding material stack 102 adheres to bonding surface 106 of wafer 100. As shown in FIG. 2, bonding material stack 102 includes a plurality of layers 120 each including boron (B) and nitrogen (N). As will be described herein, plurality of layers 120 may include: a first boron oxynitride (BON) layer 122 adhered to wafer 100, i.e., adhered to SiOx interface layer 112 (FIG. 1) or to bonding surface 106 (FIG. 2) of wafer 100. Where SiOx interface layer 112 (FIG. 1) is provided, first BON layer 122 may be doped with an oxygen dopant. Plurality of layers 120 may also include: a boron nitride (BN) layer 124 over first boron oxynitride layer 122; a second boron oxynitride (BON) layer 126 over boron nitride layer 124; and a silicon-containing boron oxynitride layer (Si—BON) 128 over second BON layer 126. In one embodiment, second BON layer 126 may include a silicon dopant. In any event, for purposes that will be described herein, Si—BON layer 128 includes more silicon than the silicon-doped second BON layer 126. Further details of the various layers of bonding material stack 102 will be apparent in the description of methods of bonding a wafer that follow.

Figure 3:
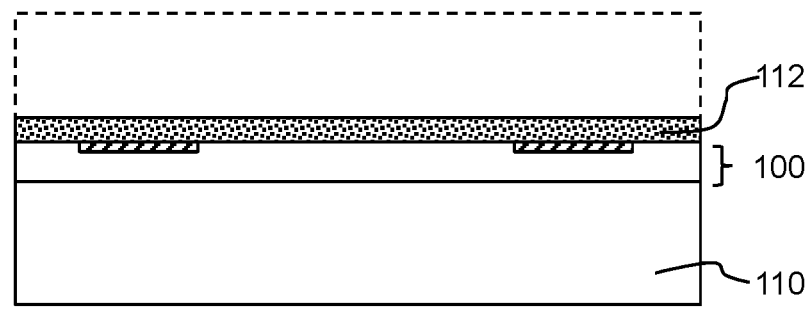
FIGS. 3-8 shows enlarged cross-sectional views of processes of bonding wafers using a boron and nitrogen based bonding stack according to other embodiments of the disclosure.

Referring to FIGS. 3-8, cross-sectional views of a method of bonding wafers 100 and forming bonding material stack(s) 102 according to embodiments of the disclosure are illustrated. In FIG. 3, a wafer 100 upon which a bonding material stack 102 is to be formed is illustrated. Wafer 100 is shown including a handle wafer 110, which may include any now known or later developed substrate for allowing movement and bonding of wafer 100 without damaging wafer 100. It is understood that one or both wafers 100 (one shown) that are to be bonded may include bonding material stack 102. Where a wafer 100 is bonded on both sides, bonding material stack 102 may be formed on both sides.

For purposes of description, FIGS. 3-8 show wafer 100 including a SiOx interface layer 112. Where SiOx interface layer 112 is used, the layer may be deposited to a thickness greater than approximately 600 nanometers, as shown by the phantom box, on bonding surface 106 of wafer 100. Subsequently, SiOx interface layer 112 may be planarized to thin SiOx interface layer 112 by greater than 500 nanometers, leaving less than 100 nm of SiOx interface layer 112. Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad (not shown) and wafer 100 are pressed together by a dynamic polishing head and held in place by a plastic retaining ring. The dynamic polishing head is rotated with different axes of rotation (that is, not concentric). This removes material and tends to even out any "topography," making the wafer flat and planar. Other currently conventional planarization techniques may include: oxidation; chemical etching; deposition of films of low-melting point glass; re-sputtering of deposited films to smooth them out; low-viscosity liquid epoxies; spin-on glass (SOG) materials; and/or sacrificial etch-back.

Figure 4:
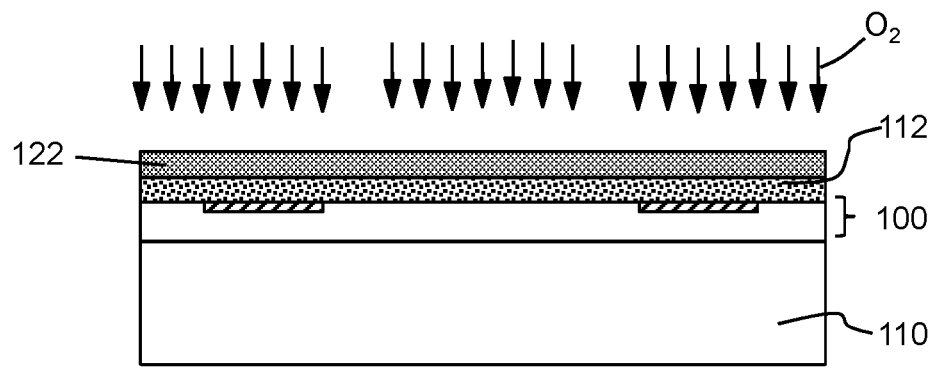

FIGS. 4-7 show forming plurality of layers 120 (FIG. 2) each including boron and nitrogen to wafer 100, i.e., either to SiOx interface layer 112 or bonding surface 106 (FIG. 2). Unless otherwise stated, each layer 122, 124, 126, 128 may be deposited using any now known or later developed process, e.g., any of the afore-mentioned deposition techniques. FIG. 4 shows forming first BON layer 122. First BON layer 122 adheres to wafer 106, e.g., through known cohesion processes. More specifically, as shown in FIG. 2, first BON layer 122 may adhere to bonding surface 106 of wafer 100. Alternatively, as shown in FIG. 4, first BON layer 122 may adhere to wafer 100 via SiOx interface layer 112, where provided. In this case, in order to provide better adherence to wafer 100, especially to SiOx interface layer 112, first BON layer 122 may be doped (represented by arrows) with an oxygen dopant. The oxygen ions may be introduced into first BON layer 122 in-situ during formation of first BON layer 122, or using ion implantation after forming. In any event, first BON layer 122 may have a thickness of less than approximately 100 nanometers (nm). First BON layer 122, in contrast to conventional bonding materials, provides high thermal conductivity, and exhibits a high cohesive strength to bonding surface 106 or SiOx layer 112 (whether oxygen doped or not). In addition, in contrast to conventional bonding materials, first BON layer 122 can optionally include a tunable compressive stress that acts to reduce wafer 100 bow and allows for better alignment accuracy, i.e., it reduces wafer expansion and stress interfaces within the wafer.

Figure 5:
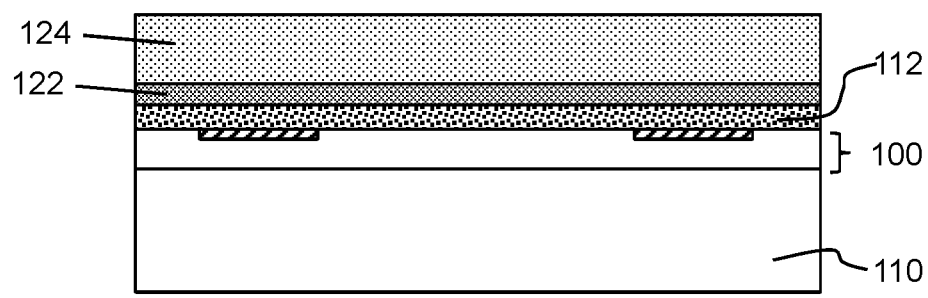

FIG. 5 shows forming BN layer 124 over first BON layer 122. BN layer 124 may have a thickness of approximately 200 nm to 2000 nm. BN layer 124 is an advantageous bonding material because of its strength and hardness (similar to diamond), and provides exceptional thermal conductivity, e.g., >1200 W/m-K. In addition, it has a strong cohesive strength to first BON layer 122. However, BN layer 124 is not an adequate bonding layer alone because it cannot be readily planarized. Further, BN layer 124 provides mediocre adhesion to SiOx interface layer 112, which is better provided by first BON layer 124.

Figure 6:
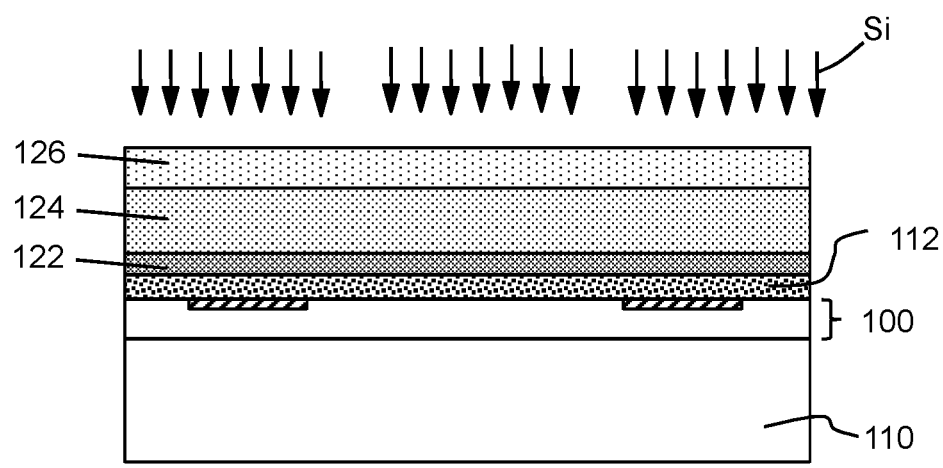
Figure 7:
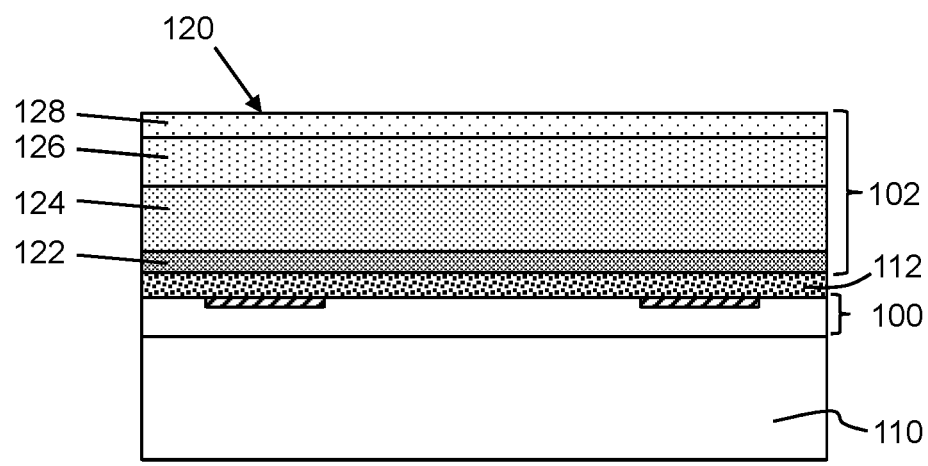

FIGS. 6 and 7 show forming second BON layer 126 over BN layer 124 and silicon-containing boron oxynitride (Si—BON) layer 128 over second BON layer 126, respectively. Second BON layer 126 may have a thickness of less than approximately 200 nm; and Si—BON layer 128 may have a thickness of less than approximately 100 nm. Si—BON layer 128 may be formed using a single batch PECVD using silane ($SiH_4$), boron tri-chloride ($BCl_3$), nitrogen oxide ($N_2O$) and ammonia ($NH_3$), or layer-by-layer deposition and oxidation of silicon boron nitride (SiBN) using an ozone ($O_3$) plasma. BON layer 126 may be formed using the former process with no or little silicon. BON layers 126, 128 are provided to allow planarization of bonding material stack 102 and improve hydrophilicity of bonding material stack 102. As understood, bonding material stack 102, like any bonding material, should have a planar surface for proper alignment of wafers 102 and ideal bonding. Since BN layer 124 is not readily planarized, BON layers 126, 128 provide improved planarization. In addition, BON layers 126, 128 provide improved hydrophilicity compared to BN layer 124, which is advantageous for bonding because the ability to absorb some water acts to improve a bond interface by, for example, enabling a high density of surface Si—OH groups for hydrophilicity bonding, and making planarization easier, e.g., via CMP.

As an option, as shown in FIG. 6, to provide additional hydrophilicity and/or improved bonding with Si—BON layer 128, second BON layer 126 may be doped (represented by arrows) with a silicon dopant prior to forming Si—BON layer 128. The silicon ions may be introduced into second BON layer 126 in-situ during formation of second BON layer 126, or using ion implantation after forming. In any event, Si—BON layer 128 includes more silicon than the silicon doped second BON layer 126. As a final step of forming bonding material stack 102, Si—BON layer 128 may be planarized, e.g., using any of the planarizing techniques listed herein such as CMP, prior to the bonding of wafers.

Figure 8:
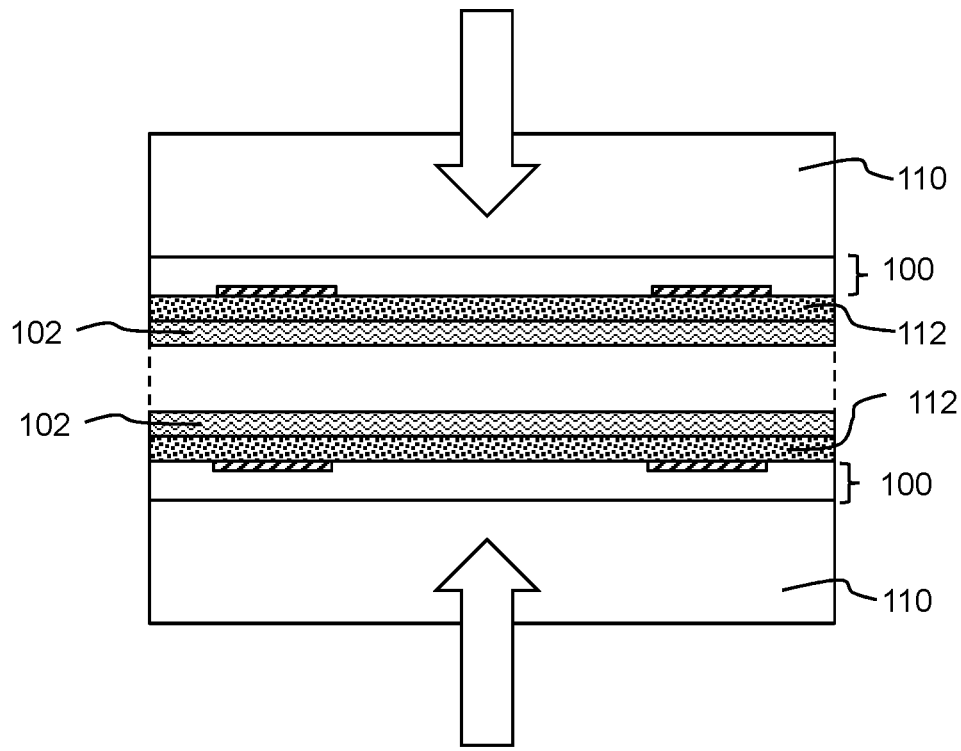

FIG. 8 shows bonding two wafers 100 together using plurality of layers 120 (FIGS. 2 and 7) of bonding material stack 102. Note, in FIG. 8, bonding material stack 102 has been reduced in size from its enlarged illustration in FIGS. 2-7 for clarity. As illustrated, each wafer 100 includes a bonding material stack 102, but as noted herein, only one wafer 100 may require it. The bonding may include any now known or later developed technique for bonding wafers 100. That is, any technique can be employed to bring boron and nitrogen based bonding stack(s) 102 of each wafer 100 into aligned contact. An anneal follows to permanently bond wafers 100. Bonding material stack 102, in contrast to certain conventional techniques, allows annealing at a temperature below approximately 350° C.

Bonding material stack 102 provides improved thermal conductivity (e.g., between 3 and 10 W $m^{-1}$ $K^{-1}$) compared to conventional LTO techniques (e.g., 1 W $m^{-1}$ $K^{-1}$), high cohesive strength, the ability to apply compressive stress to reduce wafer bow, and provides water absorption that provides better bond interface properties (e.g., less voids) compared to conventional LTO techniques.

Figure 9:
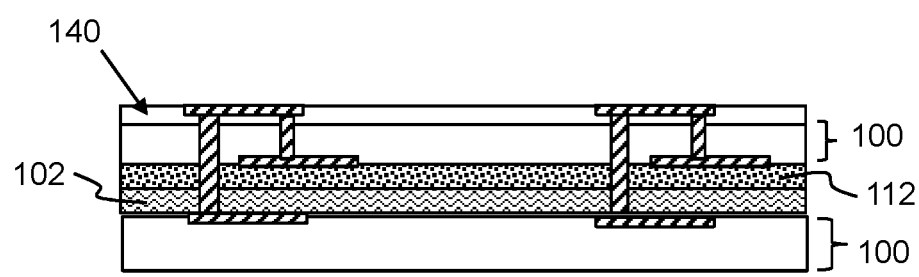
FIG. 9 shows a cross-sectional view of a 3Di system including a boron and nitrogen based bonding stack according to embodiments of the disclosure.

FIG. 9 shows a three-dimensional integrated circuit (3Di) system 140 formed according to embodiments of the disclosure, and including additional conventional steps such as thinning steps, forming of through silicon vias (TSVs) to electrically connect wafers, formation of additional wiring for subsequent TSVs to additional wafers, etc. While FIG. 9 shows a pair of wafers 100, more than two wafers may be bonded in a stack in a known fashion using bonding material stack 102. In FIG. 9, handle wafers 110 have been remove. 3Di system 140 may include at least two wafers 100 bonded together, each wafer 100 including an integrated circuit therein. At least one wafer 100 of the at least two wafers bonded together may include bonding material stack 102, i.e., plurality of layers 120 (FIGS. 2 and 7), bonding the at least one wafer to another wafer. As noted herein, each of plurality of layers 120 (FIGS. 2 and 7) include boron and nitrogen.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The methods as described above is used in the fabrication of integrated circuit chips. The resulting integrated circuit chips in a packaged form (3Di systems). The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A bonding material stack for wafer-to-wafer bonding, the bonding material stack comprising:
   a plurality of layers each including boron and nitrogen;
   wherein the plurality of layers includes:

a first boron oxynitride layer for adhering to a wafer;
a boron nitride layer over the first boron oxynitride layer;
a second boron oxynitride layer over the boron nitride layer; and
a silicon-containing boron oxynitride layer over the second boron oxynitride layer.

2. The bonding material stack of claim 1, further comprising a silicon oxide interface layer between the first boron oxynitride layer and the wafer, and wherein the first boron oxynitride layer includes an oxygen dopant.

3. The bonding material stack of claim 1, wherein the second boron oxynitride layer includes a silicon dopant, and wherein the silicon-containing boron oxynitride layer includes more silicon than the silicon-doped second boron oxynitride layer.

4. The bonding material stack of claim 1, wherein:
the first boron oxynitride layer has a thickness of less than approximately 100 nanometers (nm);
the boron nitride layer has a thickness of approximately 200 nm to 2000 nm;
the second boron oxynitride layer has a thickness of less than approximately 200 nm; and
the silicon-containing boron oxynitride layer has a thickness of less than approximately 100 nm.

5. The bonding material stack of claim 1, wherein the first boron oxynitride layer includes a compressive stress therein.

6. A method of bonding wafers, the method comprising:
for each wafer to be bonded, adhering a plurality of layers each including boron and nitrogen to the wafer; and
bonding the wafers together using the plurality of layers;
wherein the plurality of layers adhering includes, for each wafer, forming:
a first boron oxynitride layer adhered to the wafer;
a boron nitride layer over the first boron oxynitride layer;
a second boron oxynitride layer over the boron nitride layer; and
a silicon-containing boron oxynitride layer over the second boron oxynitride layer.

7. The method of claim 6, further comprising forming a silicon oxide interface layer on each wafer prior to forming the first boron oxynitride layer, and further comprising doping the first boron oxynitride layer with an oxygen dopant.

8. The method of claim 7, further comprising planarizing the silicon oxide interface layer prior to forming the first boron oxynitride layer.

9. The method of claim 7, wherein forming the silicon oxide interface layer includes depositing greater than approximately 600 nanometers of silicon oxide on a bonding surface of each wafer, and planarizing to thin the silicon oxide interface layer by greater than 500 nanometers.

10. The method of claim 6, further comprising doping the second boron oxynitride layer with a silicon dopant prior to forming the silicon-containing boron oxynitride layer, wherein the silicon-containing boron oxynitride layer includes more silicon than the silicon doped second boron oxynitride layer.

11. The method of claim 6, further comprising planarizing the silicon-containing boron oxynitride layer prior to the bonding.

12. The method of claim 6, wherein the bonding the wafers includes:
bringing each wafer into aligned contact; and
annealing at a temperature below approximately 350° C.

13. A three-dimensional (3D) integrated circuit system, the system comprising:
at least two wafers bonded together, each wafer including an integrated circuit therein, wherein at least one wafer of the at least two wafers bonded together includes a plurality of layers bonding the at least one wafer to another wafer of the at least two wafers, each of the plurality of layers including boron and nitrogen;
a first boron oxynitride layer adhered to the at least one wafer;
a boron nitride layer over the first boron oxynitride layer;
a second boron oxynitride layer over the boron nitride layer; and
a silicon-containing boron oxynitride layer over the second boron oxynitride layer.

14. The 3D integrated circuit system of claim 13, wherein the second boron oxynitride layer includes a silicon dopant, and wherein the silicon-containing boron oxynitride layer includes more silicon than the silicon-doped second boron oxynitride layer.

15. The 3D integrated circuit system of claim 13, wherein:
the first boron oxynitride layer has a thickness of less than approximately 100 nanometers (nm);
the boron nitride layer has a thickness of approximately 200 nm to 2000 nm;
the second boron oxynitride layer has a thickness of less than approximately 200 nm; and
the silicon-containing boron oxynitride layer has a thickness of less than approximately 100 nm.

16. The 3D integrated circuit system of claim 13, further comprising a silicon oxide interface layer between the first boron oxynitride layer and the at least one wafer, and wherein the first boron oxynitride layer includes an oxygen dopant.

17. The 3D integrated circuit system of claim 16, wherein the silicon oxide interface layer has a thickness of less than 100 nanometers.

* * * * *